(12) United States Patent
Pramanik et al.

(10) Patent No.: US 9,082,927 B1
(45) Date of Patent: Jul. 14, 2015

(54) CATALYTIC GROWTH OF JOSEPHSON JUNCTION TUNNEL BARRIER

(71) Applicant: Intermolecular, Inc., San Jose, CA (US)

(72) Inventors: Dipankar Pramanik, Saratoga, CA (US); Frank Greer, Pasadena, CA (US); Andrew Steinbach, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 27 days.

(21) Appl. No.: 14/137,640

(22) Filed: Dec. 20, 2013

(51) Int. Cl.
*H01L 39/00* (2006.01)
*H01L 39/24* (2006.01)
*C23C 16/455* (2006.01)
*C23C 14/34* (2006.01)
*H01L 39/22* (2006.01)
*C23C 14/08* (2006.01)

(52) U.S. Cl.
CPC .......... *H01L 39/2493* (2013.01); *C23C 14/083* (2013.01); *C23C 14/34* (2013.01); *C23C 16/45525* (2013.01); *H01L 39/223* (2013.01)

(58) Field of Classification Search
CPC ............ H01L 39/2493; H01L 39/2496; H01L 39/223; H01L 39/225; H01L 39/226
See application file for complete search history.

(56) References Cited

U.S. PATENT DOCUMENTS

| 5,399,881 | A | 3/1995 | Bozovic et al. |
| 7,449,345 | B2 | 11/2008 | Horng et al. |
| 7,598,579 | B2 | 10/2009 | Horng et al. |
| 8,119,424 | B2 | 2/2012 | Mather et al. |
| 2013/0001668 | A1 | 1/2013 | Frank |

FOREIGN PATENT DOCUMENTS

JP 02217469 A 8/1990

OTHER PUBLICATIONS

Ritala et al.; Atomic Layer Deposition of Oxide Thin Films with Metal Alkoxides as Oxygen Sources; Apr. 14, 2000; Science AAAS; pp. 319-321.
Lu et al.; Fabrication of Nb/Al2O3/Nb Josephson Junctions Using in situ Magnetron Sputtering and Atomic Layer Deposition; Oct./Nov. 2012; IIEEE/CSC & ESAS European Superconductivity News Forum, No. 22; 5 pages.

*Primary Examiner* — Colleen Dunn

(57) ABSTRACT

A tunnel barrier layer in a superconducting device, such as a Josephson junction, is made from catalytically grown silicon dioxide at a low temperature (<100 C, e.g., 20-30 C) that does not facilitate oxidation or silicide formation at the superconducting electrode interface. The tunnel barrier begins as a silicon layer deposited on a superconducting electrode and covered by a thin, oxygen-permeable catalytic layer. Oxygen gas is dissociated on contact with the catalytic layer, and the resulting oxygen atoms pass through the catalytic layer to oxidize the underlying silicon. The reaction self-limits when all the silicon is converted to silicon dioxide.

16 Claims, 4 Drawing Sheets

CATALYTIC GROWTH OF JOSEPHSON JUNCTION TUNNEL BARRIER

BACKGROUND

Related fields include superconducting devices, particularly Josephson junctions, and catalytically grown oxide thin films.

Superconductivity—zero resistance to direct electrical current and expulsion of magnetic fields—results from a phase transition that occurs in some materials at temperatures lower than a critical temperature. For many metals and alloys, the critical temperature is less than 20 degrees Kelvin; for some materials (e.g., high-temperature superconducting ceramics) the critical temperature is higher.

In a superconducting material, the electrons become paired ("Cooper pairs"), attracted very slightly to each other as a result of interactions with a surrounding ionic lattice that is distorted in proximity to the electrons. When paired, the electrons' energy state is lowered, forming a small (0.002 eV) energy gap around the Fermi level. The gap inhibits the electron/lattice collisions that manifest as normal electrical resistance, so that the electrons move through the ionic lattice without being scattered.

A Josephson junction is a thin layer of a non-superconducting material between two superconducting layers. Pairs of superconducting electrons can tunnel through the thin non-superconducting layer ("tunnel barrier") from one of the adjacent superconductors to the other. Types of Josephson junctions include S-I-S (superconductor, insulator, superconductor; also known as a superconducting tunnel junction, "STJ"), S-N-S (superconductor, non-superconducting metal, superconductor), or S-s-S (all-superconductor, with a superconductivity-weakening physical constriction in the middle section).

When a current is applied to a Josephson junction, the voltage across it is either zero (if the current I is below a critical current $I_c$) or an AC voltage, typically near ~500 GHz/mV (if $I \geq I_c$). If a DC voltage is applied across a Josephson junction, the current oscillates with a frequency proportional to the voltage: $f=(2e/h)V$, where f is the frequency, e is the electron charge, h is Planck's constant, and V is the applied voltage,). If a Josephson junction is irradiated with electromagnetic radiation of frequency $f_a$, (e.g., a microwave frequency), the Cooper pairs synchronize with $f_a$ and its harmonics, producing a DC voltage across the junction. STJs can be used as elements of quantum logic, rapid single flux quantum circuits, and single-electron transistors; as heterodyne mixers and superconducting switches such as quiterons; as magnetometers, e.g. superconducting quantum interference devices (SQUIDs); and as other sensors such as voltmeters, charge sensors, thermometers, bolometers and photon detectors. However, mass production of STJ-based devices has been challenging, in part because critical current and critical current density tends to vary among STJs formed on different parts of a substrate.

Cooper pairs merge into a condensate in velocity space, also called a collective quantum wave. If the insulator in an STJ is sufficiently thin, the wave can "spill out" of the superconductor and the electron pair can tunnel through the insulator, but excess thickness can prevent an STJ from functioning. Control of the thickness of the tunnel barrier is thus critical to STJ performance; it generally needs to be about 3 nm or less, and in some cases between 0.07 and 1.5 nm.

In addition, Cooper pairing is easily disrupted by defects such as grain boundaries and cracks, which can create Josephson weak links ("accidental" Josephson junctions). In a superconducting microwave circuit, the weak links cause nonlinearity in resistance and reactance, intermodulation of different microwave tones, and generation of unwanted harmonics. Control of defects, both in bulk materials and at interfaces, is therefore also critical.

Unwanted oxidation of the superconducting electrodes has been identified as a source of excess tunnel-barrier thickness (because the extra oxide adds to the intentionally formed tunnel barrier), defects, and non-uniformity of critical current and critical current density in STJs. Therefore, a need exists for fabrication methods that prevent or remove the unwanted electrode oxidation and produce a tunnel barrier layer with as few defects as possible.

SUMMARY

The following summary presents some concepts in a simplified form as an introduction to the detailed description that follows. It does not necessarily identify key or critical elements and is not intended to reflect a scope of invention.

Some embodiments of a tunnel barrier for an STJ are made of silicon dioxide ($SiO_2$) at process temperatures less than 100C, e.g., 20-30C. Compared to the aluminum oxide ($Al_2O_3$) tunnel barrier used in many STJs, $SiO_2$ has a larger barrier height (~9 eV compared to ~8 eV) and is less prone to defect formation.

In some embodiments, the tunnel barrier layer is formed by initially depositing 0.5-3 nm of Si by physical vapor deposition (PVD) in an oxygen-free atmosphere to prevent oxidation of the underlying electrode. In situ (without exposing the substrate to an uncontrolled ambient), a very thin layer (e.g., 0.1-0.2 nm) of a transition metal oxide catalyst, such as titanium oxide (TiO or $TiO_2$, generically "$TiO_x$") is formed on the Si layer by PVD, either from a titanium oxide target or from a Ti target in an oxygen atmosphere.

When oxygen gas ($O_2$) is injected into the chamber, some of it passes through the thin $TiO_x$ and is catalyzed into atomic oxygen. The atomic oxygen reacts with the underlying Si to form $SiO_2$. The reaction stops when all the Si is converted to $SiO_2$. The low process temperature prevents the underlying electrode from forming unwanted oxides or silicides during the tunnel barrier formation. Once formed, the tightly bound $SiO_2$ in the tunnel barrier layer can withstand higher process temperatures without altering its interfaces with the electrodes.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" contemplates up to 5% variation. When the word "or" is used in reference to a list of two or more items, that word covers all of the following interpretations of the word: any of the items in the list, all of the items in the list and any combination of the items in the list.

"Above," "below," "bottom," "top," "side" (e.g. sidewall), "higher," "lower," "upper," "over," and "under" are defined with respect to the plane of the substrate. "On" indicates direct contact; "above" and "over" allow for intervening elements. "On" and "over" include conformal configurations covering feature walls oriented in any direction.

As used herein: "Adsorb" may include chemisorption, physisorption, electrostatic or magnetic attraction, or any other interaction resulting in part of the precursor adhering to the substrate surface. An "oxide of an element" may include additional components besides the element and oxygen, including but not limited to a dopant or alloy. "Film" and "layer" are synonyms representing a portion of a stack, and may mean either a single layer or a portion of a stack with multiple sub-layers (e.g., a nanolaminate).

Material descriptions such as "conductor," "superconductor," "semiconductor," "dielectric," and "insulator" may vary with temperature for a given material, and shall be used herein to describe the characteristics of the materials at the intended operating temperature of the device in which the materials are used. For example, "forming a superconducting layer" shall mean "forming a layer of a material expected to exhibit superconductivity at the intended operating temperature of the device being fabricated."

Figure 1A:
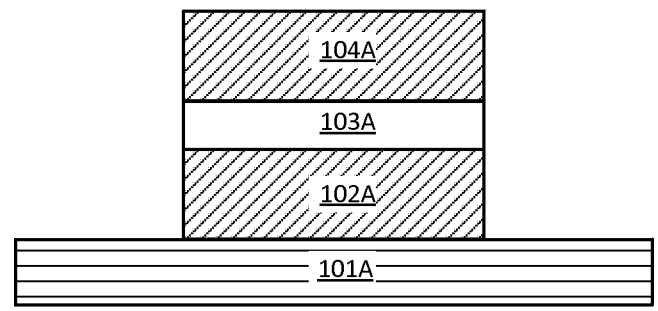
FIGS. 1A-1B conceptually illustrate some configurations of layers of an STJ.
Figure 1B:
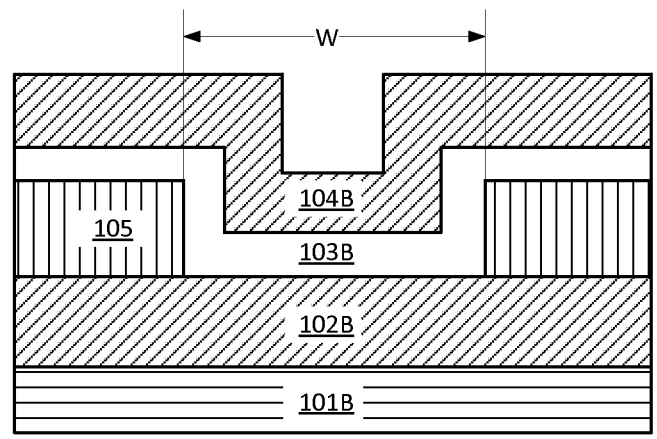

FIGS. 1A-1B conceptually illustrate some configurations of layers of an STJ. Each of the substrates 101A and 101B may include underlying layers and structures. In FIG. 1A, the STJ is formed by the "tri-layer" method. A first superconducting electrode layer 102A, a tunnel barrier layer 103A, and a second superconducting electrode layer 104A form a pillar. The pillar may be formed, for example, by depositing blanket layers of the STJ materials (materials are discussed in detail near the end of this Description) and patterning (e.g., etching) them into one or more pillar shapes.

In FIG. 1B, the STJ is formed by the "window-junction" method. A spacer dielectric 105 separates first superconducting electrode layer 102B from tunnel barrier layer 103B except within an opening (the "window" of width W), that is etched or otherwise formed in spacer dielectric 105. Tunnel barrier layer 103B is formed to contact first superconducting electrode layer 102B within the window; then a second superconducting electrode layer 104B is formed over tunnel barrier layer 103B. Sidewall coverage within the window may not be critical because the spacer dielectric 105 outside the tunnel barrier sidewalls is not likely to be a source or sink of leakage current.

A common source of parasitic oxidation of the electrode is the oxidant used in forming the tunnel barrier layer in methods such as atomic layer deposition (ALD) and chemical vapor deposition (CVD). Typical oxidants for these processes include water, ozone, hydrogen peroxide, and occasionally oxygen gas. Until the oxidant encounters the precursor with which it is intended to react, the oxygen in these oxidants is free to react with anything else it may encounter, including the underlying electrode. A single monolayer of deposited material from the other precursor, or in some cases even a few monolayers of reacted oxide, may not be sufficient to prevent the free oxidants from reaching and parasitically oxidizing the underlying electrode.

It is also possible to form very thin layers (~0.2 nm) by PVD. 0.5-3 nm of PVD Si protects the bottom electrode from parasitic oxidation more effectively than a monolayer or sub-monolayer of ALD precursor. Once this layer is formed, a catalytic layer of a refractory metal oxide, such as $TiO_x$, can be formed over the Si layer by PVD, CVD or ALD without oxidizing the underlying electrode. This catalytic layer is very thin (0.1-0.2 nm) so that when it splits $O_2$ molecules into free O atoms, the O atoms can permeate through the catalytic layer to react with the underlying Si and convert it to $SiO_2$ at temperatures below 100C. At these low temperatures, the underlying electrode is unlikely to react with any O atoms that reach the bottom of the Si layer.

Figure 2:
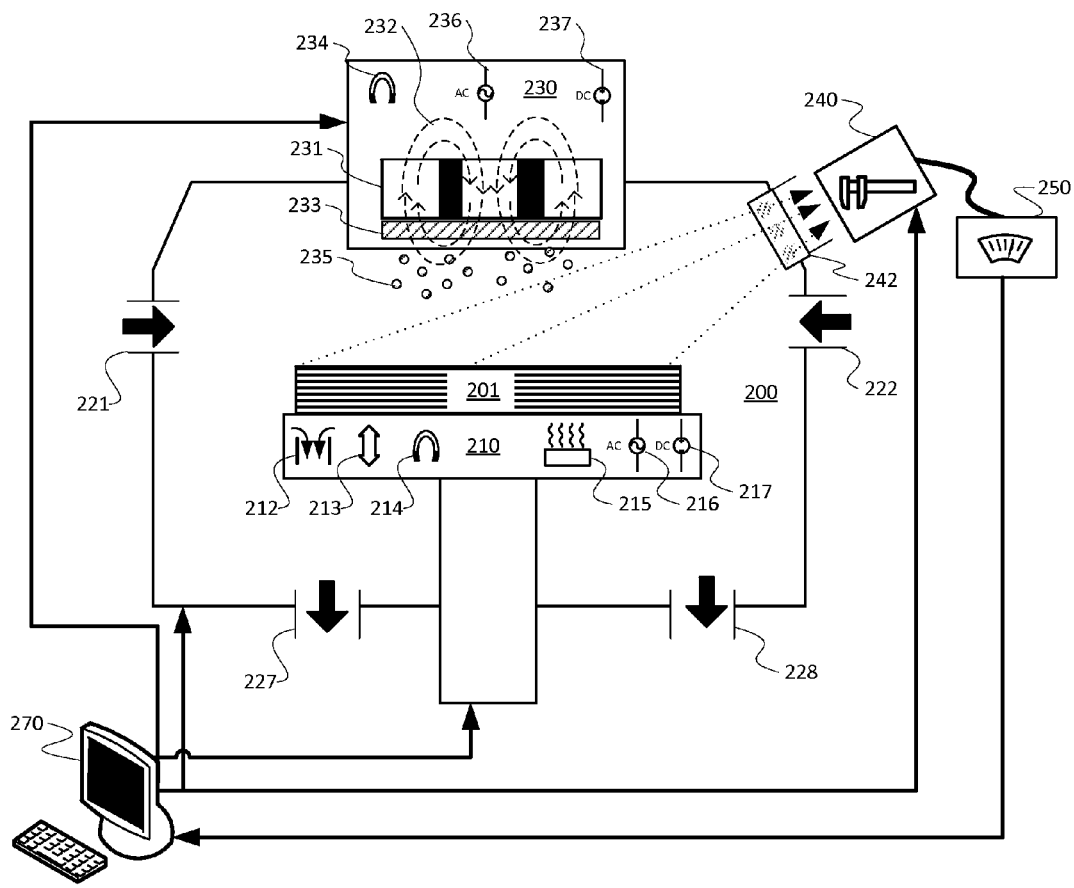
FIG. 2 is a conceptual diagram of a PVD chamber.

FIG. 2 is a conceptual diagram of a PVD chamber. Chamber 200 includes a substrate holder 210 for holding a substrate 201. Substrate holder 210 may include a vacuum chuck 212, translation or rotational motion actuators 213, a magnetic field generator 214, a temperature controller 215, and circuits for applying an AC voltage bias 216 or DC voltage bias 217 to substrate 201. Some chambers include masks (not shown) for exposing only part of substrate 201 to the PVD process. The masks may be movable independent of the substrate. Chamber 200 includes inlets 221, 222 and exhausts 227, 228 for process gases. Process gases for PVD may include inert gases such as nitrogen or argon, and may also include reactive gases such as hydrogen or oxygen.

Chamber 200 includes least one sputter gun 230 for sputtering elementary particles 235 (such as atoms or molecules) from a sputter target 233 by means of plasma excitation from the electromagnetic field generated by magnetron 231. Sputter gun 230 may include adjustments for magnetic field 234, AC electric field 236, or DC electric field 237. Some sputter guns 230 are equipped with mechanical shutters (not shown) to quickly start or stop the exposure of substrate 201 to elementary particles 235. Some PVD chambers have multiple sputter guns.

Some chambers 200 support measuring equipment 240 that can measure characteristics of the substrate 201 being processed through measurement ports 242. Results for measuring equipment 240 may be monitored by monitoring equipment 250 throughout the process, and the data sent to a controller 270, such as a computer. Controller 270 may also control functions of substrate holder 210, chamber 200 and its gas inlets and outlets 221, 222, 227, and 228, sputter gun 230, and measurement equipment 240.

Figure 3A:
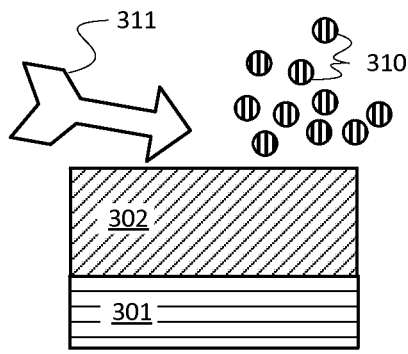
FIGS. 3A-3F conceptually illustrate tunnel barrier formation by catalytically growing silicon dioxide from sputtered Si.

FIGS. 3A-3F conceptually illustrate tunnel barrier formation by catalytically growing silicon dioxide from sputtered Si. In FIG. 3A, first superconducting layer 302 is formed on substrate 301 (which may have underlying layers and/or structures) and substrate 301 is placed in a process chamber. The first superconducting layer may be made of aluminum, niobium, a superconducting ceramic, or an organic superconductor. The exposed top surface of first superconducting layer 302 may be a blanket surface over the entire substrate, may be patterned, or may be a region exposed at the bottom of a window in a spacer dielectric as shown in FIG. 1B. One or more cleaning or pre-treating agents, symbolized by arrow 311, removes etch residues, native oxides, or any other contaminants 310 from the exposed top surface of first superconducting layer 302. Afterward, the chamber may be purged.

Figure 3B:
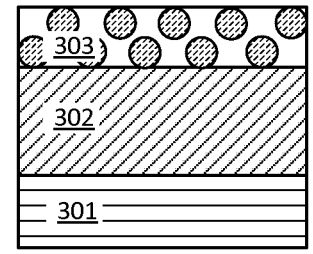

In FIG. 3B, a layer of Si 303 is deposited by PVD in an oxygen-free atmosphere at a process temperature less than 100C, such as 25-30C. A neutral sputter gas, such as Ar, may be present in the chamber. Si layer 303 may be 0.5-3 nm thick. Because of the low temperature, silicides will not form at the interface of Si layer 303 and first superconducting layer 302. Surface roughness of a PVD Si layer is typically about 0.3 nm rms or more.

Figure 3C:
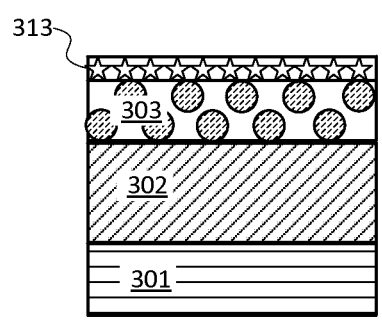

In FIG. 3C, a catalytic layer 313 is formed over the Si layer at a process temperature less than 100C, such as 25-30C. Non-limiting examples of materials for catalytic layer 313 include refractory metal oxide, such as $TiO_x$, $CeO_x$, $HfO_x$, $LaO_x$, or $MoO_x$, their compounds or alloys, or any material that dissociates $O_2$ may be used. Catalytic layer 313 may be formed by PVD from a refractory metal oxide target, PVD from a refractory metal target in the presence of an oxidant, CVD, or ALD. In some embodiments, catalytic layer 313 is formed as an un-oxidized metal layer (e.g., Ti) to be oxidized in the next step. Catalytic layer 313 may be ~0.1-0.2 nm thick; it needs to be thin enough to be permeable to oxygen atoms.

Figure 3D:
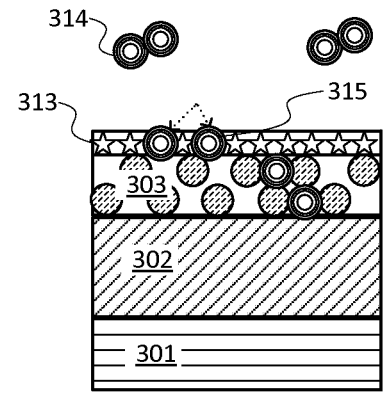

In FIG. 3D, oxygen gas molecules 314 are let into the chamber at a process temperature less than 100C, such as 25-30C. Catalytic layer 313, if not already an oxide, may be oxidized by oxygen gas 314. Oxygen gas molecules 314 encountering catalytic layer 313 are dissociated into oxygen atoms 315. Oxygen atoms 315 pass through catalytic layer 313 into Si layer 303 and bond with Si atoms in Si layer 303. Because of the low temperature, the O atoms do not react with the underlying bottom electrode.

Figure 3E:
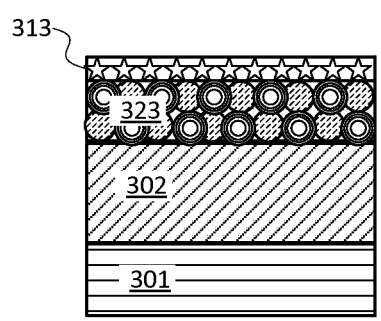

In FIG. 3E, once all the Si in Si layer 303 is converted to $SiO_2$, the reaction self-limits. High-quality $SiO_2$ tunnel junction layer 323 remains between un-oxidized bottom electrode 302 and thin catalytic layer 313. At this point all remaining oxygen is purged from the chamber. Optionally, tunnel junction layer 323 may be post-treated with UV radiation, plasma, or annealing. Fully converted layer 323 is now temperature tolerant; annealing will not cause electrode oxidation.

Figure 3F:
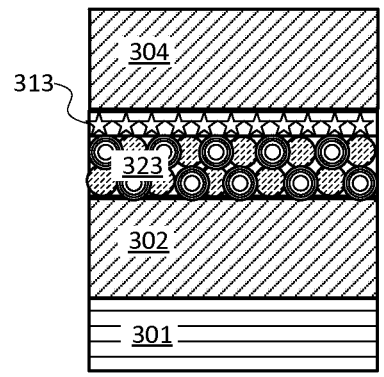

In FIG. 3F, second superconducting layer (top electrode) 304 is formed over catalytic layer 313. The second superconducting layer may be made of aluminum, niobium, a superconducting ceramic, or an organic superconductor. Because the tunnel barrier layer 323 is completely converted to $SiO_2$, this layer may optionally be formed at a higher temperature without risk of electrode oxidation.

Figure 4:
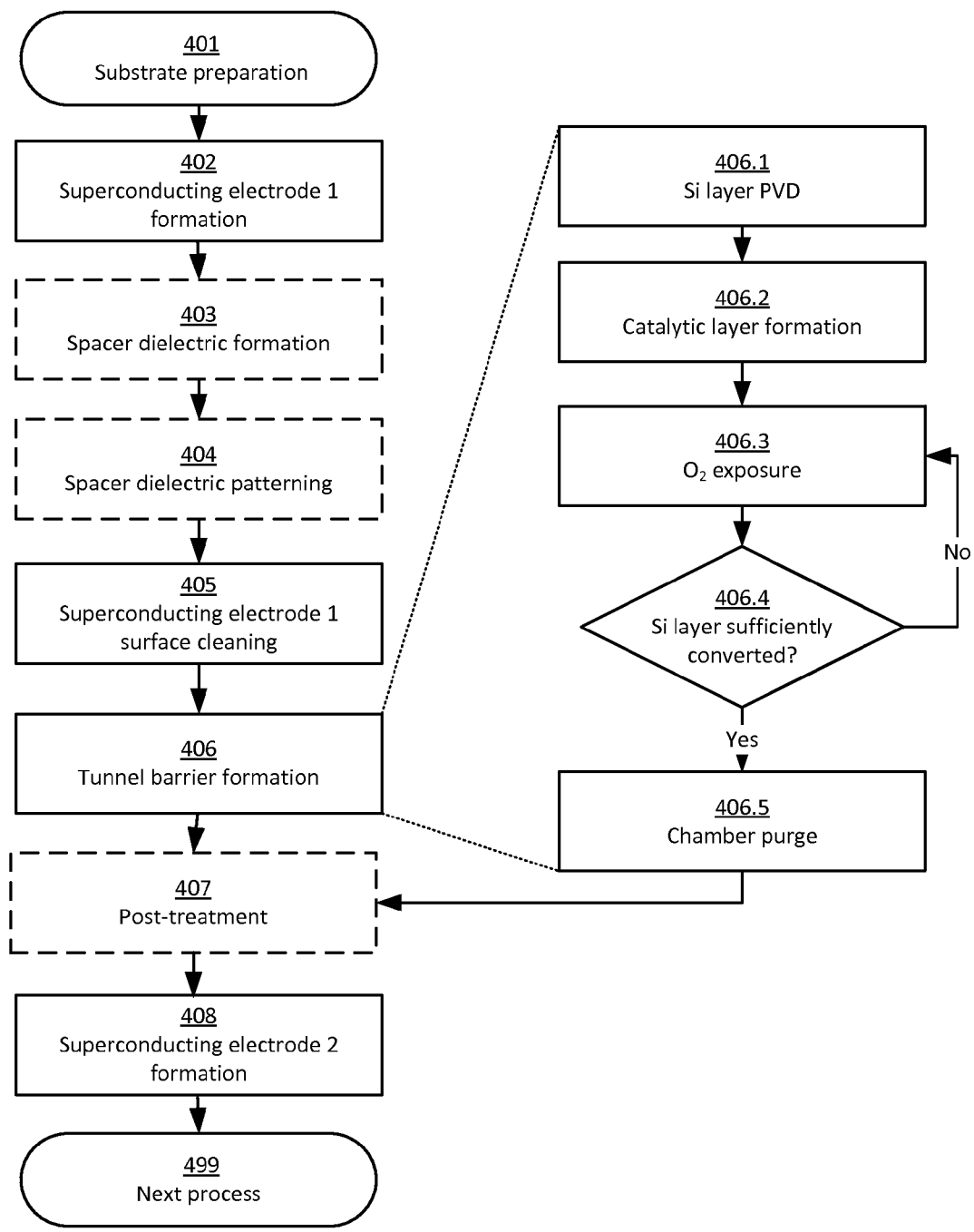
FIG. 4 is a flowchart of an example process for forming a tunnel barrier layer by catalytically growing silicon dioxide from sputtered Si.

FIG. 4 is a flowchart of an example process for forming a tunnel barrier layer by catalytically growing silicon dioxide from sputtered Si. Substrate preparation 401 may include cleaning, degassing, and/or formation of underlying interconnects and other layers or structures. Formation 402 of the first superconducting electrode layer may be done by ALD, electrochemical deposition, chemical vapor deposition (CVD), physical vapor deposition (PVD), plasma-enhanced variations, or any other suitable method, depending on the materials and dimensions required. In some embodiments, formation 402 may include patterning. In some embodiments, such as window-junction fabrication methods, spacer dielectric formation 403 and spacer dielectric patterning 404 may follow first superconducting electrode layer formation 402, but in some embodiments, such as tri-layer fabrication, they may be omitted.

The cleaning 405 of the exposed surface of the first superconducting electrode layer may include Ar sputtering, wet cleaning, or reduction of unwanted oxides by H* radicals or other plasma-generated species. A purge of the chamber may be included as a final step of cleaning 405. In some embodiments, the substrate is not exposed to an uncontrolled ambient atmosphere between cleaning 405 and tunnel barrier formation 406. For example, the two treatments may be done in suitably equipped chambers sharing a controlled environment, or in the same chamber.

The tunnel barrier formation 406 takes place at a process temperature below 100C, such as 20-30C, and includes the processes of Si layer PVD 406.1, catalytic layer formation 406.2, exposure to oxygen gas 406.3 until the Si layer is sufficiently converted 406.4, and a chamber purge 406.5. In some embodiments, the entire barrier formation 406 takes place in a single controlled environment, such as a single process chamber or a set of process chambers that share a common controlled environment.

Si layer PVD 406.1 may sputter Si from a target at a power density of ~2-2.5 $W/cm^2$ at a chamber pressure of ~1 mTorr. An inert gas such as Ar may be present in the chamber. Catalytic layer formation 406.2 may include PVD, CVD or ALD and may form a ~0.1-0.2 nm thick metal oxide layer or any other layer that dissociates oxygen gas on contact and is permeable to oxygen atoms. For ALD, any suitable low-temperature metal precursor and oxidant may be used. Alternatively, catalytic layer formation 406.2 may form a ~0.1-0.2 nm thick metal layer that oxidizes during exposure to oxygen gas 406.3. The metal may be a refractory metal such as Ce, Hf, La, Mo, or Ti. Catalytic layer formation 406.2 self-limits when the Si layer is fully converted to $SiO_2$, which may take 3-30 minutes depending on layer thickness, oxygen pressure, and other factors. When the Si layer is sufficiently converted 406.4, a chamber purge 406.5 removes the remaining oxygen gas, unbonded radicals, and any other by-products from the chamber.

Optionally, a post-treatment 407 may follow the tunnel barrier formation 406. Post-treatment 407 may densify the tunnel barrier or remove defects. For example, post-treatment 407 may include UV irradiation (e.g., 220-350 nm light), low-energy plasma treatment (e.g., <300 W), or a rapid anneal for up to 30 s at a temperature of up to 950 C. In some embodiments, post-treatment 407 may include patterning.

After tunnel barrier formation 406, or after optional post-treatment 407 if it is done, is the formation 408 of the second superconducting electrode layer. Method similar to those used for the first superconducting electrode layer, or other methods suites to the materials and dimensions of the second superconducting electrode layer, may be used. In some embodiments, formation 408 may include patterning.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:
1. A method, comprising:
   forming a first superconducting layer over a substrate;
   forming a silicon layer above the first superconducting layer;
   forming an oxygen-permeable layer above the silicon layer; and exposing the substrate to oxygen gas until at least part of the silicon layer is converted to silicon dioxide;

wherein the silicon layer is formed by physical vapor deposition;

wherein the forming of the silicon layer, the forming of the oxygen-permeable layer, and the exposing of the substrate to oxygen gas are performed at a temperature less than 100 C.

2. The method of claim 1, wherein the oxygen-permeable layer comprises a transition metal or an oxide of the transition metal.

3. The method of claim 2, wherein the transition metal comprises cerium, hafnium, lanthanum, molybdenum, titanium, or an alloy thereof.

4. The method of claim 2, wherein the oxide of the transition metal comprises titanium dioxide or titanium monoxide.

5. The method of claim 1, wherein the oxygen-permeable layer is formed by sputtering from a transition metal oxide target.

6. The method of claim 1, wherein the oxygen-permeable layer is formed by sputtering from a transition metal target in the presence of an oxidant.

7. The method of claim 6, wherein the oxidant comprises water, hydrogen peroxide, ozone, or oxygen gas.

8. The method of claim 1, wherein the oxygen-permeable layer comprises a transition metal that oxidizes when the oxygen-permeable layer is exposed to the oxygen gas.

9. The method of claim 1, wherein the oxygen-permeable layer is formed by atomic layer deposition.

10. The method of claim 1, wherein the temperature is between about 20 C and about 30 C.

11. The method of claim 1, wherein a thickness of the oxygen-permeable layer is between about 0.1 nm and about 0.2 nm.

12. The method of claim 1, wherein a power density at a silicon target during the forming of the silicon layer is between about 2 W/cm$^2$ and 2.5 W/cm$^2$.

13. The method of claim 1, wherein a thickness of the silicon layer is between about 0.5 nm and about 3 nm.

14. The method of claim 1, wherein an ambient chamber pressure around the substrate is less than about 10 mTorr while the silicon layer and the oxygen-permeable layer are being formed.

15. The method of claim 1, wherein the substrate is exposed to the oxygen gas until substantially the entire silicon layer is converted to silicon dioxide.

16. The method of claim 1, wherein the substrate is exposed to the oxygen gas for between about 3 minutes and about 30 minutes.

* * * * *